(12) United States Patent
Kim et al.

(10) Patent No.: US 9,298,038 B2
(45) Date of Patent: Mar. 29, 2016

(54) LIGHT EMITTING UNIT HAVING REFLECTOR AND LENS AND DISPLAY DEVICE HAVING THE SAME

(71) Applicant: Samsung Display Co., Ltd., Yongin, Gyeonggi-Do (KR)

(72) Inventors: Kyungmin Kim, Hwaseong-si (KR); Youngchun Kim, Seoul (KR); Byungseo Yoon, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/335,276

(22) Filed: Jul. 18, 2014

(65) Prior Publication Data

US 2015/0188010 A1 Jul. 2, 2015

(30) Foreign Application Priority Data

Dec. 30, 2013 (KR) .................. 10-2013-0167188

(51) Int. Cl.
| | | |
|---|---|---|
| *H01L 33/00* | (2010.01) | |
| *G02F 1/1335* | (2006.01) | |
| *H01L 33/58* | (2010.01) | |
| *H01L 33/52* | (2010.01) | |
| *H01L 33/48* | (2010.01) | |
| *H01L 33/60* | (2010.01) | |

(52) U.S. Cl.
CPC ........ *G02F 1/133605* (2013.01); *H01L 33/483* (2013.01); *H01L 33/486* (2013.01); *H01L 33/52* (2013.01); *H01L 33/58* (2013.01); *H01L 33/60* (2013.01); *G02F 2001/133607* (2013.01)

(58) Field of Classification Search
CPC ....... H01L 33/483; H01L 33/54; H01L 33/56; H01L 33/58; H01L 33/60; H01L 2924/1204; H01L 33/62; H01L 33/486; H01L 33/642; H01L 33/64; H01L 33/52; H01L 33/46; H01L 33/405; H01L 33/50
USPC .............................................. 257/98, 99, 100
See application file for complete search history.

(56) References Cited

U.S. PATENT DOCUMENTS

| | | | |
|---|---|---|---|
| 7,029,150 B2 | 4/2006 | Finch | |
| 2005/0162854 A1 | 7/2005 | Finch | |
| 2008/0191225 A1* | 8/2008 | Medendorp | ..................... 257/98 |
| 2011/0037084 A1 | 2/2011 | Sekii et al. | |
| 2011/0084896 A1 | 4/2011 | Ito et al. | |
| 2011/0149578 A1* | 6/2011 | Niiyama et al. | ............... 362/294 |
| 2013/0264947 A1* | 10/2013 | Ouderkirk et al. | ............ 315/151 |
| 2015/0097200 A1* | 4/2015 | Bergmann et al. | ............... 257/89 |

FOREIGN PATENT DOCUMENTS

| | | |
|---|---|---|
| JP | 2009-080357 | 4/2009 |
| JP | 2012-002968 | 1/2012 |
| JP | 2012-226983 | 11/2012 |
| KR | 1020050096834 A | 10/2005 |
| KR | 102006004717 A | 1/2006 |

* cited by examiner

*Primary Examiner* — Minh-Loan Tran
(74) *Attorney, Agent, or Firm* — Innovation Counsel LLP (57) ABSTRACT

Provided is a display device. The display device may include a display panel, a light-emitting unit, and a bottom cover. The light-emitting unit may include a light-emitting element configured to emit light, a substrate mounted with the light-emitting element, a reflector covering the light-emitting element and configured to reflect the light, and a first lens configured to transmit the reflected light to the outside.

19 Claims, 5 Drawing Sheets

LIGHT EMITTING UNIT HAVING REFLECTOR AND LENS AND DISPLAY DEVICE HAVING THE SAME

CROSS-REFERENCE TO RELATED APPLICATIONS

This U.S. non-provisional patent application claims priority under 35 U.S.C. §119 to Korean Patent Application No. 10-2013-0167188, filed on Dec. 30, 2013, in the Korean Intellectual Property Office, the entire contents of which are hereby incorporated by reference in their entirety.

BACKGROUND

Example embodiments of the inventive concept relate to a light-emitting unit and a display device with the same.

In general, display devices are classified into three types: transmission, semi-transmission, or reflection. The transmission and semi-transmission display devices has a display panel for displaying images and a backlight unit for providing light to the display panel.

Depending on the position of the light-emitting unit, the backlight unit is classified into two types: edge-type and direct-type. For the edge-type backlight unit, a light-emitting unit is disposed beside and behind the display panel, while for the direct-type backlight unit, the light-emitting unit is disposed on an overall back surface of the display panel.

SUMMARY

Example embodiments of the inventive concept provide a light-emitting unit emitting light with improved color uniformity.

Other example embodiments of the inventive concept provide a display device capable of providing improved display quality.

According to example embodiments of the inventive concept, a display device may include a display panel configured to display an image, a light-emitting unit configured to provide light to the display panel, and a bottom cover connected to the light-emitting unit.

In example embodiments, the light-emitting unit may include at least one light-emitting element, a substrate, at least one color-changing part, a reflector, a first lens, and a second lens. The light-emitting element may be configured to emit a light of a first color (e.g., one of blue, red, and green). The light-emitting element may be provided in a plurality and the light-emitting elements configured to emit lights of different colors and disposed spaced apart from each other on the substrate.

In example embodiments, the substrate may be provided below the light-emitting elements, and the light-emitting elements may be mounted on the substrate. The light-emitting elements may be spaced apart from each other on the substrate. The color-changing part may be disposed on the substrate to cover the light-emitting elements and at least a portion of the substrate. However, in other embodiments, the color-changing part may be disposed to cover a corresponding one of the light-emitting elements.

In example embodiments, the reflector may be provided on the substrate to cover the substrate and the light-emitting elements covered with the color-changing part. Further, the reflector may be disposed in such a way that the substrate, the light-emitting elements, and the reflector delimit an inner space for reflecting the light. The reflector may include a reflector frame defining a physical appearance of the reflector and a reflection layer provided on an inner surface of the reflector frame facing the substrate. The reflector may have a first opening formed at a central portion thereof.

In example embodiments, the first lens may refract the light mixed within the inner space, and this makes it possible to extract effectively the mixed light from the inner space to the outside of the reflector. The first lens may include a first portion penetrating the first opening, and a second portion connected to the first portion and located in the inner space. The first portion may be shaped like a pin, and thus, it can be inserted into the first opening. The second portion may be shaped like a sphere, and an area of the second portion may be larger than that of the first opening. However, the shape of the second portion may not be limited thereto; for example, the second portion may have a polygonal shape. The first lens may be formed of glass, quartz, or transparent polymer materials.

The second lens may be provided on the reflector and the first lens, and in this case, the light emitted from the first lens may be transmitted toward the display panel through the second lens.

The bottom cover may be provided below the display panel and be connected with the light-emitting unit. The light-emitting unit may be contained in a bottom portion of the bottom cover. In other embodiments, the light-emitting unit may be inserted into a second opening, which may be formed through a bottom portion of the bottom cover, and be connected to the bottom cover In other embodiments, the light-emitting unit may be configured to have a quantum dot sheet in place of the color-changing part. The quantum dot sheet may be provided on at least a portion of the substrate. The light-emitting elements may be arranged spaced apart from each other and from the quantum dot sheet, on the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
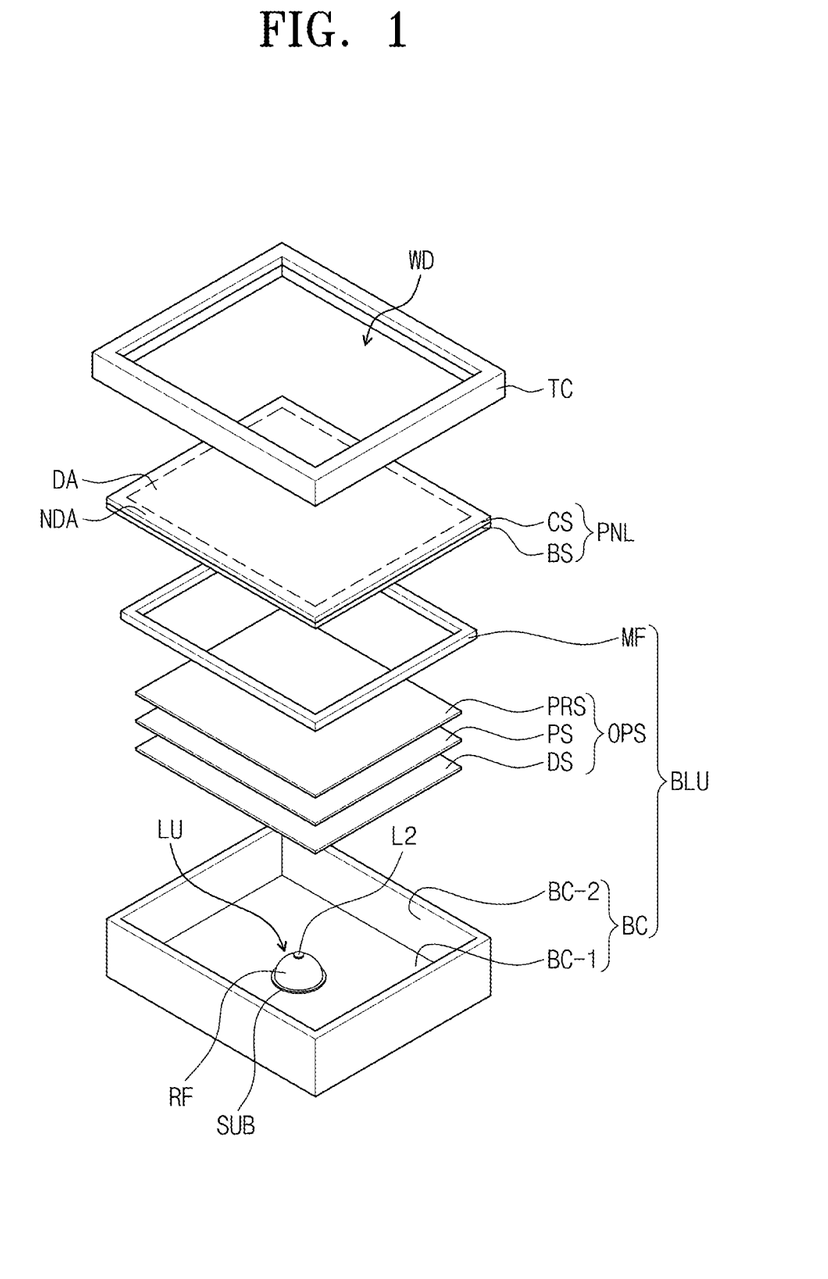
FIG. 1 is an exploded perspective view of a display device according to example embodiments of the inventive concept.

FIG. 1 is an exploded perspective view of a display device according to example embodiments of the inventive concept.

Referring to FIG. 1, the display device may include a display panel PNL, a backlight unit BLU, and a top chassis TC. Hereinafter, for ease of explanation, in the display device, a propagation direction of image or light will be referred to as an upward direction, and a direction opposite to the upward direction will be referred to as a downward direction. Nevertheless, the upward and downward directions may be relative concepts, and in certain embodiments, they may be changed to indicate other directions.

The display panel PNL may be configured to display images through a top surface thereof. The display panel PNL may be a light-receiving type display panel (for example, a liquid crystal display panel, an electrowetting display panel, an electrophoresis display panel, or a microelectromechanical system (MEMS) display panel). For the sake of simplicity, the description that follows will refer to an example of the present embodiment in which a liquid crystal display panel is used as the display panel PNL.

The display panel PNL may be provided in the form of a rectangular plate having two pairs of opposite sides, where one of the two pairs may be longer than the other. The display panel PNL may include a base substrate BS, a counter substrate CS facing the base substrate BS, and a liquid crystal layer (not shown) interposed between the base and counter substrates BS and CS. When viewed in plan view, the display panel PNL may include a display area DA for displaying images and a non-display area NDA, which is provided around the display area DA and is not used to display an image. The non-display area NDA may be covered or veiled by the top chassis TC.

In example embodiments, the base substrate BS may include a plurality of pixel electrodes (not shown) and a plurality of thin-film transistors (not shown) electrically connected to the pixel electrodes, respectively. Each of the thin-film transistors may be configured to control a switching operation of selectively providing a driving signal to a corresponding one of the pixel electrodes.

The counter substrate CS may include a common electrode (not shown), which may be used to produce electric field for controlling an orientation of liquid crystal molecules, in conjunction with the pixel electrodes. In the display panel PNL, the liquid crystal layer may be controlled to display images through the top surface of the display panel PNL. For example, images to be displayed through the display panel PNL may be adjusted by controlling the liquid crystal layer.

The backlight unit BLU may be disposed below or behind the display panel PNL to provide light toward the display panel PNL. The backlight unit BLU may include a mold frame MF supporting the display panel PNL, a light-emitting unit LU emitting light, optical sheets OPS improving efficiency of the light, and a bottom cover BC attached with the light-emitting unit LU.

The mold frame MF may be provided along an edge of the display panel PNL to support the bottom surface of the display panel PNL. Further, the mold frame MF may include a fixing member (e.g., a stopping part) (not shown), which may be configured to fasten or support components other than the display panel PNL (for example, light-emitting unit LU and the optical sheets OPS).

The mold frame MF may be provided at a position(s) corresponding to at least one of the four sides of the display panel PNL. For example, the mold frame MF may have a rectangular ring shape facing all of the four sides of the display panel PNL. Alternatively, the mold frame MF may be shaped like a letter 'U' facing three sides of the display panel PNL. The mold frame MF may be provided in the form of a single body or in the form of an assembly including a plurality of parts. The mold frame MF may be formed of an organic material (e.g., polymer resin), but example embodiments of the inventive concepts may not be limited thereto. For example, if necessary, other material can be used for the mold frame MF.

The light-emitting unit LU may be configured to emit light. In example embodiments, the light-emitting unit LU may include one or more light-emitting elements, which are mounted on a substrate SUB to emit light. The light-emitting unit LU will be described in more detail below.

The optical sheets OPS may be provided between the light-emitting unit LU and the display panel PNL. The optical sheets OPS may control the light emitted from the light-emitting unit LU. The optical sheets OPS may be or include at least one of a diffusion sheet DS, a prism sheet PS, and a protection sheet PRS stacked on the light-emitting unit LU.

The diffusion sheet DS may be configured to diffuse the light. The prism sheet PS may be configured to focus the light diffused by the diffusion sheet DS on the display panel PNL thereon in a direction perpendicular thereto. For example, most light passing through the prism sheet PS may be perpendicularly incident into the display panel PNL. The protection sheet PRS may be disposed on the prism sheet PS to protect the prism sheet PS against an external impact. In example embodiments, the optical sheets OPS may consist of one diffusion sheet DS, one prism sheet PS, and one protection sheet PRS, but example embodiments of the inventive concepts may not be limited thereto. For example, in the optical sheets OPS, at least one of the diffusion, prism, and protection sheets DS, PS, and PRS may be stacked to have a multi-layered structure, and if necessary, at least one of the diffusion, prism, and protection sheets DS, PS, and PRS may be omitted. Further, a stacking order of the diffusion, prism, and protection sheets DS, PS, and PRS may be changed, if necessary.

The bottom cover BC may be provided below the display panel PNL. The bottom cover BC may include a bottom portion BC-1 parallel to the display panel PNL and a sidewall portion BC-2 extending upward from the bottom portion BC-1. Some elements of the backlight unit BLU may be contained in a space delimited by the bottom portion BC-1 and the sidewall portion BC-2. For example, the light-emitting unit LU may be provided on the bottom portion BC-1. Although not shown, a reflecting member may be additionally disposed between the bottom portion BC-1 and the light-emitting unit LU to reflect light.

The top chassis TC may be provided on the display panel PNL. The top chassis TC may be disposed to support or cover a top edge of the display panel PNL and cover a side surface of the mold frame MF and/or the bottom cover BC. The top chassis TC may be provided to have a display window WD exposing the display area DA of the display panel PNL.

Figure 2:
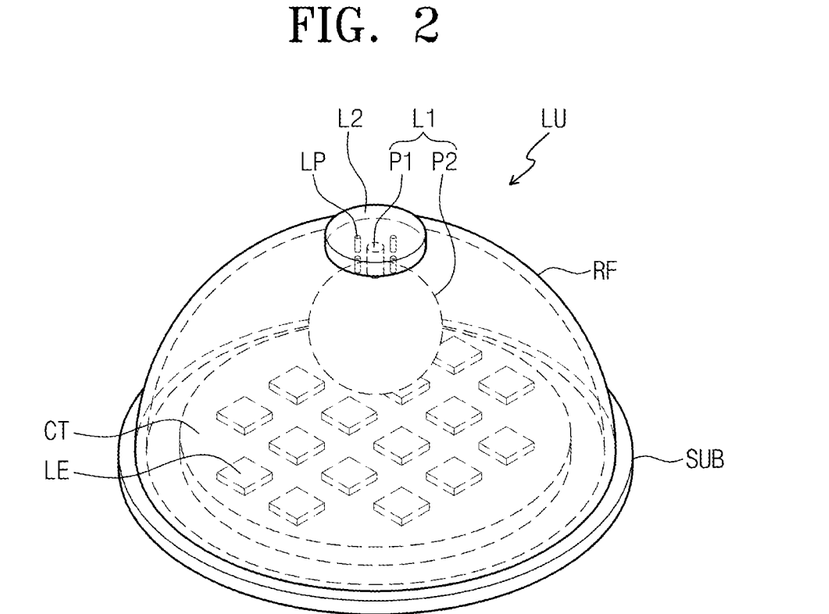
FIG. 2 is a perspective view of a light-emitting unit according to example embodiments of the inventive concept.

Hereinafter, the light-emitting unit LU according to example embodiments of the inventive concept will be described in more detail. FIG. 2 is a perspective view of a light-emitting unit according to example embodiments of the inventive concept, and FIG. 3 is a sectional view illustrating a portion of the light-emitting unit of FIG. 2.

Figure 3:
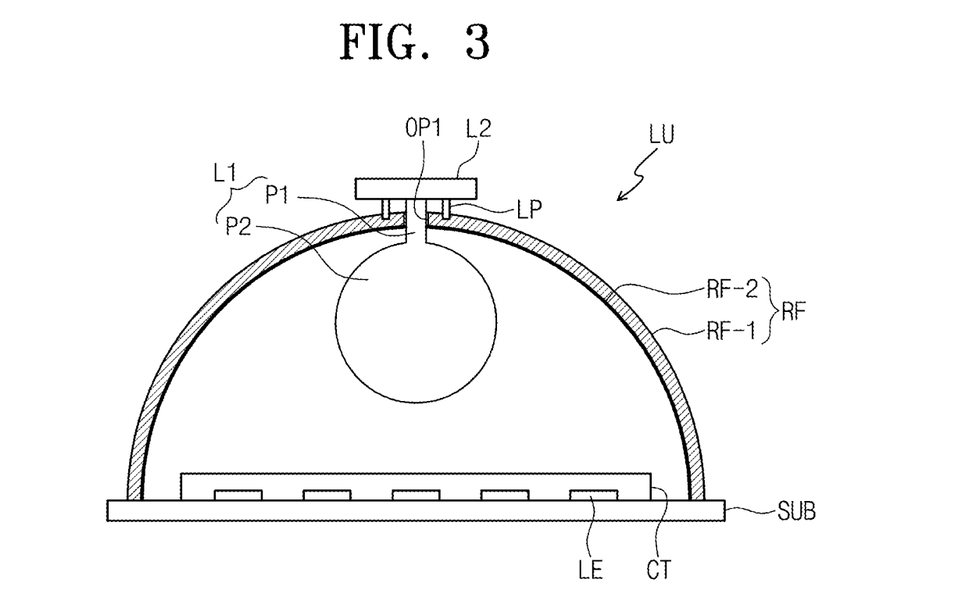
FIG. 3 is a sectional view illustrating a portion of the light-emitting unit of FIG. 2.

Referring to FIGS. 1 through 3, the light-emitting unit LU may be provided at a central region of the bottom portion BC-1 of the bottom cover BC.

The light-emitting unit LU may include a light-emitting element LE, the substrate SUB, a color-changing part CT, a reflector RF, a first lens L1, and a second lens L2.

In example embodiments, the light-emitting element LE may be configured in such a way that an amount of emitted light can be independently and minimally controlled. Although not shown, the light-emitting element LE may include a first electrode and a second electrode. The light-emitting element LE may be configured to emit light in response to driving voltages applied through the first electrode and the second electrode. The light-emitting element LE may be provided between the first and second electrodes, and in certain embodiments, it may have a n-type semiconductor layer, an active layer, and a p-type semiconductor layer that are sequentially stacked. In the case where the light-emitting element LE is applied with the driving voltage, electrons and holes may be moved to participate in a combination process generating light. Alternatively, the light-emitting element LE may be an organic light emitting element with two opposite electrodes and an organic material interposed between two electrodes.

In example embodiments, the light-emitting element LE may generate light of first color. For example, the first color may be one of blue, red, and green. The light-emitting element LE may be a single LED or a plurality of LEDs, whose light intensities are synchronously or asynchronously controlled. Hereinafter, for the sake of simplicity, the description that follows will refer to an example of the present embodiment in which the light-emitting element LE is composed of a plurality of blue LEDs. However, example embodiments of the inventive concepts may not be limited thereto, and if necessary, each of the light-emitting elements LE is composed of a plurality of LEDs with some different colors.

The substrate SUB may be provided below the light-emitting elements LE, and the light-emitting elements LE may be mounted on the substrate SUB. The light-emitting element LE may be provided as a plurality and the light-emitting elements LE disposed spaced apart from each other on the substrate SUB. In certain embodiments, the substrate SUB may be a printed circuit board printed with interconnection lines for supplying electric power to the light-emitting elements LE or controlling such a power supplying process. The substrate SUB may be provided in the form of a circular plate, but the shape of the substrate SUB will not be limited thereto. For example, the substrate SUB may have a polygonal shape (e.g., rectangle). An area of the substrate SUB may be adjusted depending on a desired amount of light for the display device.

The color-changing part CT may be provided on the substrate SUB to cover the light-emitting elements LE and at least a portion of the substrate SUB. The color-changing part CT may include at least one fluorescent material capable of changing (for example, increasing) a wavelength of light incident thereto, and thus, a fraction of the light emitted from the light-emitting elements LE may be transformed to have color (hereinafter, referred as to a "second color") different for its initial color (i.e., the first color). Lights with the first and second colors may be mixed to provide a white light. Hereinafter, for the sake of simplicity, the description that follows will refer to an example of the present embodiment in which a blue light is transformed to a yellow light through the color-changing part CT.

The reflector RF may be provided on the substrate SUB to veil the substrate SUB and the light-emitting elements LE covered with the color-changing part CT. The reflector RF may be disposed in such a way that the substrate SUB, the light-emitting elements LE, and the reflector RF delimit an inner space for reflecting the light. The reflector RF may include a reflector frame RF-1 defining a physical appearance of the reflector RF and a reflection layer RF-2 provided on an inner surface of the reflector frame RF-1 facing the substrate SUB.

Figure 4:
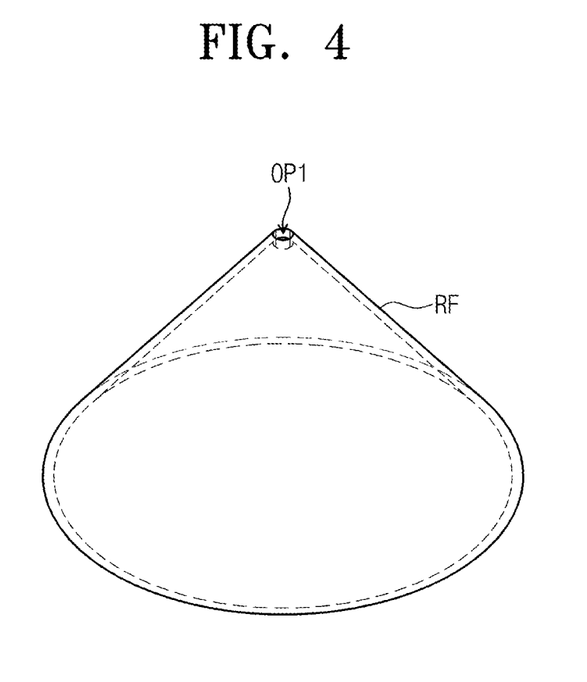
FIG. 4 is a perspective view of a reflector according to other example embodiments of the inventive concept.

The shape of the reflector RF may be given or maintained by the reflector frame RF-1. The reflector frame RF-1 may be provided in the form of a dome capable of containing the light-emitting elements LE, but the shape of the reflector frame RF-1 may not be limited thereto. For example, the shape of the reflector frame RF-1 may be variously changed, if the inner space for containing the light-emitting elements LE is made by the light-emitting elements LE. As an example of such modifications, as shown in FIG. 4, the reflector RF may have a cone shape providing the inner space. Although not shown, the reflector RF may be shaped like one of cylinder, prism, pyramid, and truncated pyramid.

Referring back to FIGS. 1 through 3, the reflector frame RF-1 may be formed of metal, plastic, or glass. The reflection layer RF-2 may be formed of a reflective white material (e.g., barium sulfate $BaSO_4$). Light emitted from the light-emitting elements LE and transformed by the color-changing part CT may be reflected several times by the reflection layer RF-2 and be mixed within the inner space.

When viewed in plan view, the reflector RF may have a first opening OP1 formed at a central portion thereof. The light mixed within the inner space may be emitted through the first opening OP1.

Figure 5:
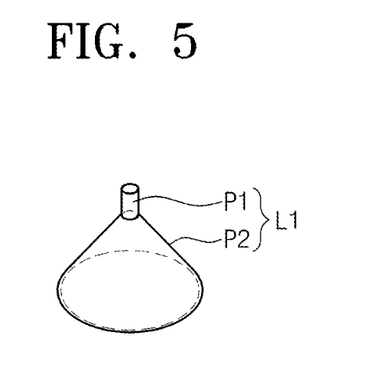
FIG. 5 is a perspective view of a first lens according to other example embodiments of the inventive concept.

The first lens L1 may refract the light mixed within the inner space, and this makes it possible to extract effectively the mixed light from the inner space to the outside of the reflector RF. The first lens L1 may include a first portion P1 penetrating the first opening OP1, and a second portion P2 connected to the first portion P1 and located in the inner space. The first portion P1 may be shaped like a pin, and thus, it can be inserted into the first opening OP1. The second portion P2 may be shaped like a sphere, and an area of the second portion P2 may be larger than that of the first opening OP1, when viewed in a plan view. However, the shape of the second portion P2 may not be limited thereto. For example, the second portion P2 may have a polygonal shape, when viewed in a plan view. In other words, the shape of the first lens L1 may be variously modified. As an example, as shown in FIG. 5, the first lens L1 may be configured to include the first portion P1 shaped like a pin and the second portion P2 shaped like a cone and connected to the first portion P1, but the shape of the first lens L1 or the second portion P2 may not be limited thereto. Although not shown, the second portion P2 may be shaped like one of cylinder, prism, pyramid, and truncated pyramid.

Referring back to FIGS. 1 through 3, the light mixed within the reflector RF may be emitted to the outside of the reflector RF via the second and first portions P2 and P1 of the first lens L1.

The first lens L1 may be formed of glass, quartz, or transparent polymer materials (e.g., polycarbonate (PC), poly(methylmethacrylate) (PMMA), polyethylene terephthalate (PET), polyethylene naphthalate (PEN), polyether imide (PEI), polyimide (PI), or polypropylene (PP). Further, the first lens L1 may further include a diffuser scattering the light.

The second lens L2 may be provided on the reflector RF and the first lens L1, and in this case, the light emitted from the first lens L1 may be transmitted toward the display panel PNL through the second lens L2. The second lens L2 may be disposed on the first opening OP1 to cover the first portion P1. The second lens L2 may include at least one connecting portion LP, which may be provided on a bottom surface of the second lens L2 and be connected to the reflector RF. As shown in FIG. 2, the second lens L2 may be configured to have four connecting portions LP, but example embodiments of the inventive concepts may not be limited thereto.

As described above, at least one light-emitting unit LU may be used in the display device according to example embodiments of the inventive concept. In the case where a plurality of LEDs are disposed below the display panel, it is necessary to increase an area of the substrate. However, in the case where the light-emitting unit LU is singly used, it is possible to reduce size and cost of the substrate SUB, compared with the above case that the substrate having the large area to be mounted the plurality of LEDs are used.

The use of the light-emitting unit LU makes it possible to provide a white light mixed in the inner space to the display panel PNL, and thus, color uniformity of the display panel PNL can be improved. For example, it is possible to suppress or prevent color separation phenomenon, which may occur when lights emitted from LEDs are diffused using a lens. As an example, it is possible to prevent the lights with first and second colors, which are emitted from the LEDs and the color-changing part, respectively, from being separated, and thus, the display device can have an improved quality of display.

In the light-emitting unit LU, the second lens L2 may be configured to have a uniform size. Even in the case that a size of the light-emitting unit LU is large, the second lens L2 may be configured in such a way that its size is suitable for a given area of the first opening OP1.

According to example embodiments of the inventive concept, since one light-emitting unit LU and one second lens L2 are used in a one-to-one manner, it is possible to reduce cost of the product, compared with the conventional case that a plurality of lenses and a plurality of LEDs are used.

In example embodiments, the light-emitting unit LU may include a plurality of light-emitting elements LE with several intensities. For example, at least one of the light-emitting elements LE may be configured to emit a light amount or intensity different from the others. Since the lights emitted from the light-emitting elements LE are mixed in the inner space, it is possible to apply the plurality of light-emitting elements LE for one light-emitting unit LU, even if the light-emitting elements LE have different optical intensities. In the conventional art, a light-emitting element, whose optical intensity is beyond the desired range, has been regarded as a failed device. However, according to example embodiments of the inventive concept, if in the light-emitting unit LU, such a light-emitting element LE can have a required intensity property, it may be used for the light-emitting unit LU. This makes it possible to reduce the product cost. Further, by virtue of the mixing of the lights in the reflector RF, the light emitted from the light-emitting unit LU can have a single color, regardless of disposition or arrangement of the light-emitting elements on the substrate SUB.

According to example embodiments of the inventive concept, in the light-emitting unit LU, the color-changing part CT may be formed to cover the light-emitting elements LE and the substrate SUB, but example embodiments of the inventive concepts may not be limited thereto. For example, the color-changing part CT may be locally disposed within each of the light-emitting elements LE.

Figure 6:
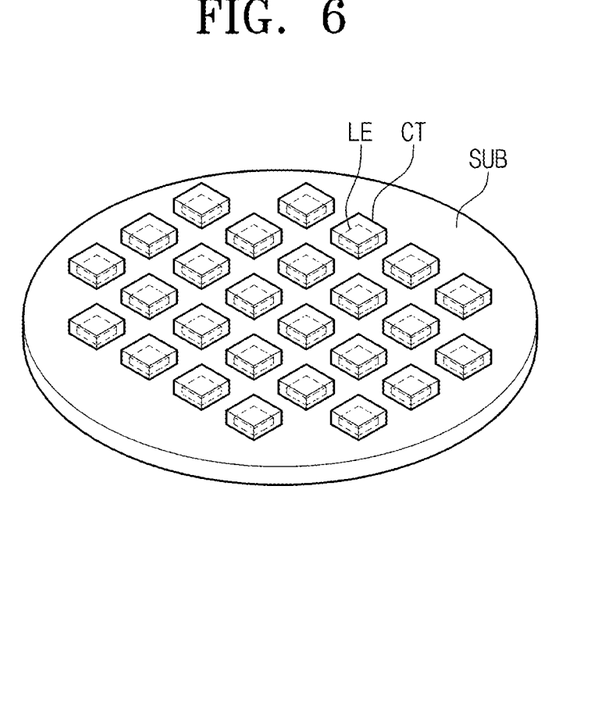
FIG. 6 is a perspective view of a substrate with light-emitting elements according to other example embodiments of the inventive concept.

FIG. 6 is a perspective view of a substrate with light-emitting elements according to other example embodiments of the inventive concept. In the following description of light-emitting elements, a previously described element may be identified by a similar or identical reference number without repeating an overlapping description thereof, for the sake of brevity.

Referring to FIG. 6, a plurality of the light-emitting elements LE may be disposed spaced apart from each other on the substrate SUB. In certain embodiments, the substrate SUB may be a printed circuit board printed with interconnection lines for supplying electric power to the light-emitting elements LE or controlling such a power supplying process. The substrate SUB may be provided in the form of a circular plate, but the shape of the substrate SUB will not be limited thereto. For example, the substrate SUB may have a polygonal shape (e.g., rectangle).

A plurality of the color-changing part CT may be provided on the substrate SUB to cover the light-emitting elements LE, respectively. The color-changing parts CT may be configured to change or increase a wavelength of light incident thereto, and thus, a fraction of the light emitted from the light-emitting elements LE may be transformed to have color (hereinafter, referred as to a "second color") different for its initial color (i.e., the first color). The lights with the first and second colors may be mixed or combined to exhibit a white color. According to the present embodiments, since the color-changing parts CT are provided on the light-emitting elements LE, respectively, it is possible to prevent the color-changing parts CT from being formed on unused regions, and thus, it is possible to reduce the product cost.

As described above, the light-emitting unit LU may be configured to include the color-changing part CT allowing the light-emitting unit LU to emit the white light, but example embodiments of the inventive concepts may not be limited thereto. For example, in the light-emitting unit LU, quantum dots may be used in place of the color-changing part CT.

Figure 7:
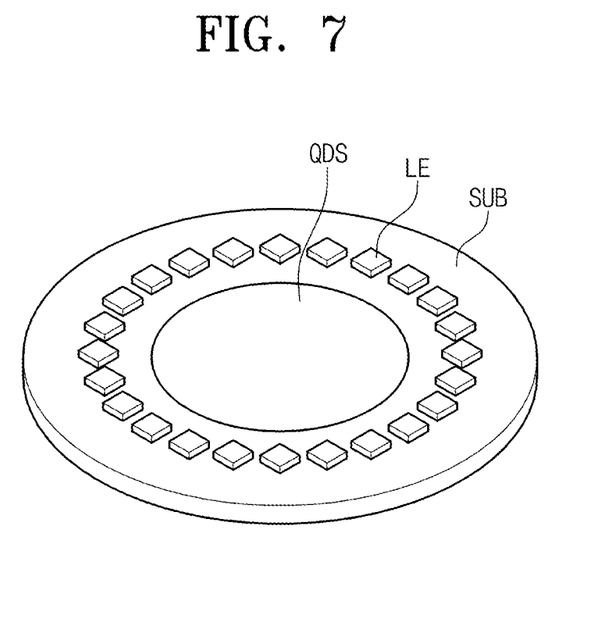
FIG. 7 is a perspective view of a substrate with light-emitting elements according to other example embodiments of the inventive concept.

FIG. 7 is a perspective view of a substrate with light-emitting elements according to other example embodiments of the inventive concept. In the following description of a light-emitting unit with a quantum dot sheet QDS, a previously described element may be identified by a similar or identical reference number without repeating an overlapping description thereof, for the sake of brevity.

Referring to FIG. 7, a quantum dot sheet QDS may be provided on at least a portion of the substrate SUB. The quantum dot sheet QDS includes a plurality of quantum dots. Each of the quantum dots is a nano-sized structure, which may be composed of, for example, a core and a shell enclosing the core, and a ligand attached to the shell. Owing to the quantum confinement effect, if light, whose energy is larger than a band gap between energy bands of the quantum dots, is incident into the quantum dots, the quantum dots absorb the light and then are excited to emit a light having a specific wavelength. The wavelength of the emitted light is determined by the size of the quantum dots, and further, it can have a narrow full-width-half-maximum (FWHM).

In the present embodiments, if the light emitted from the light-emitting elements LE is incident into the quantum dot sheet QDS, the light emitted from the quantum dot sheet QDS may have an energy, which is equivalent to the band gap of one of the quantum dots, which the light passes through. Accordingly, by using the quantum dot sheet QDS, it is possible to transform the light of first color emitted from the light-emitting elements LE to a light having a larger wavelength (i.e., the second color) than that of the first color. In certain embodiments, the quantum dots may be formed of or include at least one of ZnSe, CdSe, or InGaP. Further, as shown in FIG. 7, the quantum dot sheet QDS may be provided in the form of a circular plate, but example embodiments of the inventive concepts may not be limited thereto. For example, the quantum dot sheet QDS may have a polygonal shape.

On the substrate, the light-emitting elements LE may be arranged spaced apart from each other along the quantum dot sheet QDS. As shown in FIG. 7, the light-emitting elements LE may be disposed along the edge of the quantum dot sheet QDS to have a ring-shaped arrangement, but the arrangement of the light-emitting elements LE may not be limited, under the condition that the light-emitting elements LE are spaced apart from the quantum dot sheet QDS by a specific or uniform space. For example, the light-emitting elements LE may be disposed to have a polygonal (e.g., rectangular) ring-shaped arrangement. According to the present embodiments, the use of the quantum dot sheet QDS makes it easy to achieve a good color reproduction property of the display device, and thus, the display device can have an improved quality of display.

Figure 8:
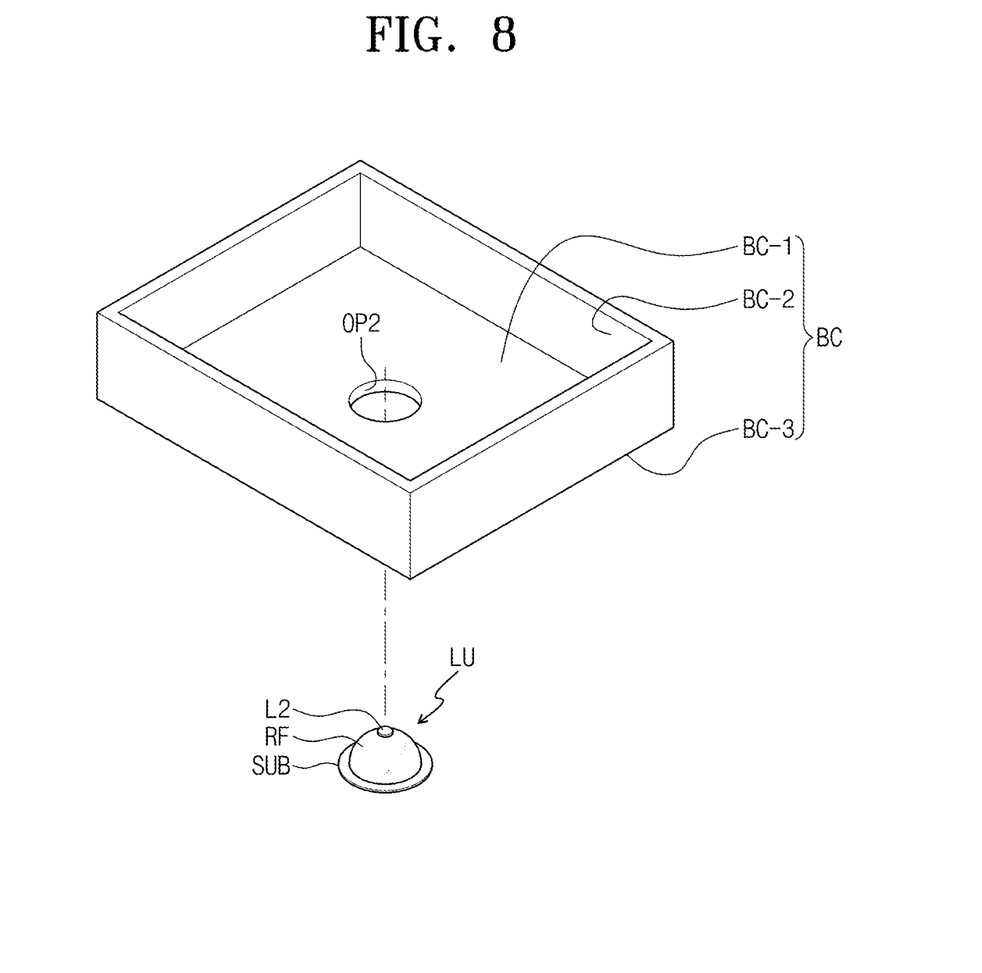
FIG. 8 is an exploded perspective view illustrating a light-emitting unit and a bottom cover attached with the light-emitting unit, according to other example embodiments of the inventive concept.

FIG. 8 is an exploded perspective view illustrating a light-emitting unit and a bottom cover attached with the light-emitting unit, according to other example embodiments of the inventive concept. In the following description of FIG. 8, a previously described element may be identified by a similar or identical reference number without repeating an overlapping description thereof, for the sake of brevity.

Referring to FIGS. 1 and 8, the bottom cover BC may include the bottom portion BC-1 parallel to the display panel PNL and the sidewall portion BC-2 extending upward from the bottom portion BC-1. The bottom portion BC-1 may have a second opening OP2, and the light-emitting unit LU may be inserted into the second opening OP2 and thereby be connected to the bottom cover BC. In certain embodiments, the light-emitting unit LU may be inserted into the second opening OP2 in a direction from a bottom surface BC-3 of the bottom portion BC-1 toward the display panel PNL.

An area of the second opening OP2 may be substantially equivalent to that of the reflector RF, when viewed in a plan view. Further, the area of the second opening OP2 may be smaller than that of the substrate SUB provided below the reflector RF, when viewed in a plan view.

As the result of the insertion of the light-emitting unit LU into the second opening OP2, the light-emitting unit LU may be easily and robustly fixed to the bottom cover BC.

According to example embodiments of the inventive concept, the light-emitting unit can be configured to emit light with improved color uniformity.

By using the light-emitting unit, the display device can be configured to have an improved display quality.

While example embodiments of the inventive concepts have been particularly shown and described, it will be understood by one of ordinary skill in the art that variations in form and detail may be made therein without departing from the spirit and scope of the attached claims.

What is claimed is:

1. A light-emitting unit, comprising:
at least one light-emitting element configured to emit light;
a substrate, on which the light-emitting element is mounted;
a reflector configured to reflect the light and having a first opening at a central region thereof, the reflector covering the substrate and the light-emitting element, wherein the substrate, the light emitting element, and the reflector define an inner space; and
a first lens configured to allow the light to propagate from the inner space to an outside of the reflector.

2. The light-emitting unit of claim 1, wherein the light-emitting element is provided in a plurality and the light-emitting elements are apart from each other on the substrate.

3. The light-emitting unit of claim 2, further comprising a color-changing part covering the light-emitting elements and at least a portion of the substrate.

4. The light-emitting unit of claim 2, further comprising a plurality of color-changing parts, each of which covers a corresponding one of the plurality of light-emitting elements.

5. The light-emitting unit of claim 1, wherein the reflector comprises a reflector frame defining a physical appearance of the reflector and a reflection layer provided on an inner surface of the reflector frame to define the inner space.

6. The light-emitting unit of claim 5, wherein the reflector frame is a dome-shaped structure.

7. The light-emitting unit of claim 6, wherein the reflector frame comprises metal, plastic, or glass.

8. The light-emitting unit of claim 6, wherein the reflection layer is made of barium sulfate.

9. The light-emitting unit of claim 1, wherein the first lens comprises a first portion inserted into the first opening and a second portion located in the inner space and connected to the first portion, and an area of the second portion is larger than that of the first opening.

10. The light-emitting unit of claim 9, wherein the first portion is a pin-shaped structure.

11. The light-emitting unit of claim 10, wherein the second portion is a spherical structure.

12. The light-emitting unit of claim 10, wherein the second portion has a polygonal shape.

13. The light-emitting unit of claim 9, wherein the first lens is made of at least one of glass, quartz, or transparent polymer materials.

14. The light-emitting unit of claim 1, further comprising a second lens provided on the reflector and the first lens configured to diffuse the light emitted from the inner space.

15. A light-emitting unit, comprising:
a plurality of light-emitting elements configured to emit light;
a substrate, on which the light-emitting elements are mounted, wherein the light-emitting elements are apart from each other on the substrate;
a reflector configured to reflect the light, the reflector covering the substrate and the light-emitting elements, wherein the substrate, the light emitting elements, and the reflector define an inner space;
a first lens configured to allow the light to propagate from the inner space to an outside of the reflector; and
a quantum dot sheet provided on at least a portion of the substrate.

16. The light-emitting unit of claim 15, wherein the light-emitting elements are arranged along an edge of the quantum dot sheet.

17. A display device, comprising:
a display panel configured to display an image;
a light-emitting unit configured to provide light to the display panel; and
a bottom cover connected to the light-emitting unit,
wherein the light-emitting unit comprises:
at least one light-emitting element configured to emit light;
a substrate, on which the light-emitting element is mounted;
a reflector configured to reflect the light and having a first opening at a central region thereof, the reflector covering the substrate and the light-emitting element, wherein the substrate, the light emitting element, and the reflector define an inner space; and
a first lens configured to allow the light to propagate from the inner space to an outside of the reflector.

18. The display device of claim 17, wherein the light-emitting unit is contained on a bottom portion of the bottom cover.

19. The display device of claim 17, wherein the bottom cover has a second opening, which is formed through the bottom portion of the bottom cover, and to which the light-emitting unit is inserted.

* * * * *